United States Patent
Stetson

(10) Patent No.: US 10,336,648 B1
(45) Date of Patent: Jul. 2, 2019

(54) SLIP COMPOSITION

(76) Inventor: Alvin R. Stetson, San Diego, CA (US)

( * ) Notice: Subject to any disclaimer, the term of this patent is extended or adjusted under 35 U.S.C. 154(b) by 0 days.

(21) Appl. No.: 07/233,708

(22) Filed: Aug. 19, 1988

Related U.S. Application Data

(62) Division of application No. 06/855,218, filed on Mar. 21, 1986.

(51) Int. Cl.
| | |
|---|---|
| *B22F 1/00* | (2006.01) |
| *B22F 3/22* | (2006.01) |
| *C03C 8/18* | (2006.01) |
| *H01F 1/09* | (2006.01) |
| *H01F 1/33* | (2006.01) |
| *H01F 1/113* | (2006.01) |
| *C03C 8/16* | (2006.01) |
| *C03C 8/14* | (2006.01) |

(52) U.S. Cl.
CPC ............... *C03C 8/18* (2013.01); *B22F 1/007* (2013.01); *B22F 1/0011* (2013.01); *B22F 1/0074* (2013.01); *B22F 3/22* (2013.01); *C03C 8/16* (2013.01); *H01F 1/09* (2013.01); *H01F 1/113* (2013.01); *H01F 1/33* (2013.01); *C03C 2204/08* (2013.01)

(58) Field of Classification Search
CPC ... C03C 14/0004; C03C 2204/08; C03C 8/18; C03C 8/16; B22F 3/22; B22F 1/0011; B22F 1/0074; B22F 1/007; H01F 1/33; H01F 1/09; H01F 1/113; H01F 1/36; H01F 1/0558; H01F 1/083; H01F 1/14741

USPC .............. 252/62.55, 62.51 R, 62.56; 501/32; 419/23, 19

See application file for complete search history.

(56) References Cited

U.S. PATENT DOCUMENTS

| | | | | |
|---|---|---|---|---|
| 1,874,127 | A * | 8/1932 | Schaefer et al. ............ | 427/126.6 |
| 2,244,360 | A * | 6/1941 | Gallup .................... | C03C 3/089 501/21 |
| 2,660,531 | A * | 11/1953 | Cianchi ..................... | C03C 8/02 501/18 |
| 4,006,479 | A * | 2/1977 | LaCombe ............ | H01Q 17/004 252/62.53 |
| 4,023,174 | A * | 5/1977 | Wright ................. | H01Q 17/004 342/4 |
| 4,178,171 | A * | 12/1979 | Steck et al. ................ | 75/0.5 AA |
| 4,179,462 | A * | 12/1979 | Olive .......................... | 75/0.5 X |
| 4,207,092 | A * | 6/1980 | Berry ........................ | 427/132 X |
| 4,268,369 | A * | 5/1981 | Barlow et al. ............. | 427/132 X |
| 4,273,807 | A * | 6/1981 | Berry .......................... | 427/132 |
| 4,544,974 | A * | 10/1985 | West, Jr. et al. ............ | 29/603 X |
| H16 | H * | 1/1986 | Kaun ......................... | 427/126.6 |
| 4,812,381 | A * | 3/1989 | Bugner et al. ................ | 430/110 |

* cited by examiner

*Primary Examiner* — C Melissa Koslow

(57) ABSTRACT

A slip composition includes an electromagnetic-absorbing, magnetic powder having a mean particle size of not more than about 6 microns, a glass or vitreous frit having a mean particle size of not more than about 6 microns, and a methyl alcohol vehicle.

A method of making a slip composition void of clay and aluminum oxide, includes mixing a wet milled vitreous frit, a powdered magnetic material, and a methyl alcohol vehicle. The disclosed embodiment is particularly useful in making an electromagnetic wave absorption coating suitable for application to stainless steel and many nickel base alloys.

8 Claims, No Drawings

SLIP COMPOSITION

This application is a divisional of Ser. No. 06/855,218 filed on Mar. 21, 1986.

TECHNICAL FIELD

The present invention relates generally to ceramic compositions and more particularly to a slip composition, i.e. an insoluble powder or powders with a vehicle to render it fluid, and to a method of making it. More particularly it relates to a method of dispersing electrically conducting or magnetic metal particles throughout a composition and the resulting slip composition which is useable to make a coating which absorbs electromagnetic waves such as radar.

BACKGROUND ART

In the prior art it is known to disperse electrically conducting or magnetic metal particles throughout an organic resinous binder, such as is disclosed in U.S. Pat. No. 4,006,479, issued Feb. 1, 1977 to D. J. LaCombe. It is also known to disperse such particles in an inorganic material, as disclosed in U.S. Pat. No. 4,023,174, issued May 10, 1977 to R. W. Wright. It is believed, however, that the slips for such inorganic materials utilize water as the vehicle. However, the use of water as the vehicle aids the oxidation of the metal particles which can reduce their electromagnetic wave absorption ability. It is desirable to provide a slip composition which overcomes the disadvantages of water as the vehicle.

U.S. Pat. No. 2,660,531, issued Nov. 24, 1953 to R. P. Fraser et al. suggests that in addition to water, one may use an "other liquid vehicle to form a 'slip'." Similarly, U.S. Pat. No. 2,244,360, issued Jun. 3, 1941 to J. L. Gallup discloses water or alcohol as the vehicle. However, neither of these patents contemplates the inclusion of electrically conducting or magnetic metal particles in the slip. It is desirable to provide a slip composition and method of making it, which is useable to make coatings which reduce the reflection of electromagnetic waves.

The present invention is directed to meeting one or more of the objectives set forth above.

DISCLOSURE OF THE INVENTION

In accordance with the present invention, there is provided a slip composition including an electromagnetic-absorbing, magnetic material having a mean particle size of not more than about 6 microns, a glass frit having a mean particle size of not more than about 6 microns, and a methanol vehicle.

Also in accordance with another aspect of the present invention there is provided a method of making a slip composition for use in making an electromagnetic wave absorption coating and characterized by the absence of clay and aluminum oxide, including mixing a wet milled vitreous frit and a powdered magnetic material together with a methanol vehicle.

BEST MODE FOR CARRYING OUT THE INVENTION

Preferably one first prepares a preliminary slip consisting of a glass frit and a methanol (methyl alcohol, i.e. $CH_3OH$) vehicle; in other words the glass frit is wet milled in the methanol. This preliminary slip may sometimes hereinafter be called a glass-methanol slip. Into the preliminary slip is mixed the electrically conducting or magnetic metal particles, preferably a special iron aluminum alloy powder, to make the final slip composition.

In preparing the glass-methanol slip the following materials are required: a suitable glass frit and methanol, purified or technical grade. While various other glass or vitreous frits may be used, depending on the substrate to be coated, following is the composition, in weight percentage, of one embodiment of a glass frit particularly suitable for use in coating stainless steel and many nickel base alloys.

|        | Percent |
|--------|---------|
| $SiO_2$ | 49 |
| $B_2O_3$ | 12 |
| $Li_2O$ | 3.6 |
| $Na_2O$ | 14.4 |
| $K_2O$ | 11.4 |
| $CaO$ | 5 |
| $SrO$ | 1.85 |
| $BaO$ | 2.75 |

The foregoing can also be expressed as weight percentages within the following ranges:

|        | Percent |
|--------|---------|
| $SiO_2$ | 44 to 54 |
| $B_2O_3$ | 10 to 14 |
| $Li_2O$ | 3 to 4 |
| $Na_2O$ | 13 to 16 |
| $K_2O$ | 10 to 13 |
| $CaO$ | 4 to 6 |
| $SrO$ | 1 to 2 |
| $BaO$ | 2 to 3 |

A second embodiment of a vitreous frit which also has been proven effective in coating stainless steels and many nickel base alloys is described hereafter in weight percentages:

|        | Percent |
|--------|---------|
| $SiO_2$ | 35 |
| $B_2O_3$ | 10 |
| $Li_2O$ | 5 |
| $BaO$ | 40 |
| $SrO$ | 5 |
| $CaO$ | 5 |

The second embodiment can also be expressed as weight percentages within the following ranges:

|        | Percent |
|--------|---------|
| $SiO_2$ | 32 to 45 |
| $B_2O_3$ | 3 to 12 |
| $Li_2O$ | 4 to 6 |
| $BaO$ | 30 to 45 |
| $SrO$ | 1 to 5 |
| $CaO$ | 1 to 5 |

The first and second embodiments provide respective measured and calculated coefficients of thermal expansion of $7.2 \times 10^{-6}/°$ F. ($13.0 \times 10^{-6}/°$ C.) and $4.46 \times 10^{-6}/°$ F. ($8.0 \times 10^{-6}/°$ C.) over the range from room temperature to 600° F. (316° C.).

It is to be understood that reference to the frit portion of the slip composition described hereafter will be the first frit embodiment. It is to be further understood that the volume ratio of the vitreous frit material/magnetic material will be substantially constant whether the first or second frit embodiment is used. Of course, differences in density between the first and second frit materials will, similarly, cause differences in the desired density of the glass-methanol slip and the final slip. The desired density of the glass-methanol and final slips which utilize the second frit embodiment, while not specifically set out herein, are within the calculation capabilities of one skilled in the art.

The composition of the glass-methanol slip has the ratio of 100 grams of the glass frit to 50 ml of methanol. This ratio should be maintained regardless of the milled particle size. The required materials are weighed and measured into a ball mill. The distribution of the glass frit should be as uniform as possible to prevent segregation. The charge is ball milled for a minimum of about 64 hours. The glass frit must be milled to a maximum average particle size of about 6 microns with no more than a trace (i.e. not over 5%) of 16 micron particles. Preferably the average particle size is less than 4 microns, advantageously near 3 microns but not less than 2 microns. When the required particle size is reached, the mix is discharged into a container that can be sealed to minimize methanol loss.

The density of the glass-methanol slip should be about 1.59 g/ml prior to use. At this density the slip contains 1.15 g of the glass frit per ml. Due to the evaporation loss of methanol, adjustment of the glass-methanol slip density may be required to control the amount of solids per ml. The slip must be thoroughly mixed before density is measured. Mixing of batches is satisfactory as long as the various batches each meet the above requirements.

The following formula may be used to find the amount of methanol to add per 100 ml of slip to reduce the density from a higher value to 1.59 g/ml:

$$\frac{100 \times \text{Density} + 0.79\,X}{100 + X} = 1.59/\text{g/ml}$$

Where "Density" is that of the slip before adjustment (g/ml), and "X" is the amount of methanol required for 100 mls.

A preferred ferromagnetic alloy composition for inclusion in the final slip is an argon atomized alloy of iron with 9 to 11 percent aluminum. Impurities should not exceed a maximum total of 2 percent.

The preferred particle size distribution is as follows as measured on any suitable commercial particle size analyzer:
- 99% less than 16 microns
- 90% less than 11 microns
- 40% less than 5 microns
- 0% less than 1 micron The mean particle size is preferably less than about 6 microns as measured on such particle size analyzer. Each lot (material produced in a continuous atomizing run) of the alloy should be analyzed to assure that the alloy is within the composition range indicated above. Each lot should also be separated and analyzed on a particle size analyzer to assure that the particle size is within the above indicated mean particle size range.

The above-described alloy is sometimes known as Fe-10% Al powder. Fe-15% Al powder is equally good, but more expensive. Other magnetic materials may be used such as those in which the major element is Fe or Co or alloys thereof, with minor amounts of Al, Cr and/or Si.

In the final slip, the ratio of glass to magnetic particles in percent volume can be as much as 30% glass to 70% magnetic particles; however in the preferred embodiment the magnetic particles are in the range of 40% to 60%. In the below-described final slip, the ratio is 44% glass particles to 56% magnetic particles.

Three materials are required to prepare the final slip which is an embodiment of the present invention: the above-described glass-methanol slip, the above-described Fe-10% Al powder or equivalent, and additional suitable methanol such as a technical grade. The order of addition shall be (1) the glass-methanol slip, (2) additional methanol, and (3) slowly, the Fe-10% Al. The material should be mixed for a minimum of three (3) minutes in a clean blender.

The density of the final slip should be from 2.60 to 2.63 g/ml and may be adjusted by the addition or removal of methanol. Table 1 shows the amount of methanol to be added per 100 ml of the slip to decrease density from 2.70 to 2.60 in increments of 0.01 g/ml.

TABLE 1

| Methanol (ml) required per 100 ml of slip | to go from 2.7 g/ml | required density g/ml |
|---|---|---|
| 0.47 | 2.70 | 2.69 |
| 0.94 | 2.70 | 2.68 |
| 1.42 | 2.70 | 2.67 |
| 1.90 | 2.70 | 2.66 |
| 2.39 | 2.70 | 2.65 |
| 2.88 | 2.70 | 2.64 |
| 3.37 | 2.70 | 2.63 |
| 3.87 | 2.70 | 2.62 |
| 4.36 | 2.70 | 2.61 |
| 4.87 | 2.70 | 2.60 |

This Table can also be used for determining the amounts of methanol to add per 100 ml of slip for any density other than 2.70 g/ml by determining the density of the slip and the density needed in column 3 of Table 1 and adding the amount of methanol obtained by subtracting the ml noted in column 1 at the present density from the ml at the required density. The difference is the amount of methanol required to change 100 ml of slip from its current density to the required density. For example, if the density is 2.69 g/ml and the required density is 2.63 g/ml, subtract 0.47 ml from 3.37 ml to obtain the required ml (i.e. 2.90 ml). For a close approximation 0.5 ml addition or removal will change the density by +0.01 g/ml.

While the final slip may be applied to a substrate in any manner known to those skilled in the art, spraying is preferred since it is quite efficient. Preparatory to spraying, the substrate should be degreased and sandblasted with nominal 80 grit garnet using techniques well known to those of ordinary skill in the art. For spraying, methanol is an essential ingredient. Propanol (propyl alcohol, i.e. $CH_3CH_2CH_2OH$) and secondary butanol (butyl alcohol, i.e. $C_4H_9OH$) were tried as the vehicles without success since they agglomerated in the sprayer and "wetted up" at applications of 2 to 5 mils. The methanol tends to evaporate during spraying and gives the appearance of a dry spray. Hence, thicker coatings (up to 50 mils) can be applied. The final slip is further exemplified by the absence of clay and aluminum oxide.

It will be understood that in addition to the ingredients specified, the compositions might in some cases contain trace impurities derived from impurities in the raw materials used for the manufacture of the ingredients. Such traces are usually innocuous but the amount of such an impurity should, of course, never be allowed to be so large as to detract from the desired properties of the composition.

It should now be appreciated, a slip composition according to the disclosure includes a ferromagnetic material having a mean particle size of not more than about 6 microns, a glass frit having a mean particle size of not more than 6 microns, and a methanol vehicle. The slip composition may include the feature wherein the glass frit has a mean particle size of not less than about 2 microns. The slip composition may also include the feature wherein the ferromagnetic material is selected from the group consisting of Fe, Co and alloys of Fe and Co. The slip composition may still also include the feature wherein the ferromagnetic material has a major element selected from the group consisting of Fe, Co and alloys thereof, with at least one minor element selected from the group consisting of Al, Cr and Si. The slip composition may also include the feature in which the maximum volume ratio of ferromagnetic material to frit is 7:3. The slip composition may also include the feature in which the volume percentage ratio of frit to ferromagnetic material is in the range to 60:40 to 40:60. The slip composition may also include the feature in which the volume percentage ratio is 44 of frit to 56 of ferromagnetic material. The slip composition may also include the feature in which the ferromagnetic material is Fe-10% Al.

While the invention has been described in preferred embodiments and specific compositions and methods, it should be understood that modifications and variations are possible in the light of the above teaching and that the invention may be otherwise practiced within the scope of the appended claims.

The invention claimed is:

1. A slip composition including ferromagnetic material having a mean particle size of not more than about 6 microns, a glass frit having a mean particle size of not more than 6 microns, and a methanol vehicle.

2. The slip composition as set forth in claim 1, wherein the glass frit has a mean particle size of not less than about 2 microns.

3. The slip composition as set forth in claim 1, wherein the ferromagnetic material is selected from the group consisting of Fe, Co and alloys of Fe and Co.

4. The slip composition as set forth in claim 1, wherein the ferromagnetic material has a major element selected from the group consisting of Fe, Co and allays thereof, with at least one minor element selected from the group consisting of Al, Cr and Si.

5. The slip composition as set forth in claim 1, in which the maximum volume ratio of ferromagnetic material to frit is 7:3.

6. The slip composition as set forth in claim 1, in which the volume percentage ratio of frit to ferromagnetic material is in the range of 60:40 to 40:60.

7. The slip composition as set forth in claim 6, in which the volume percentage ratio is 44 of frit to 56 of ferromagnetic material.

8. The slip composition as set forth in claim 4, in which the ferromagnetic material is Fe-10% Al.

\* \* \* \* \*